US008884380B2

(12) United States Patent
Tanaka

(10) Patent No.: US 8,884,380 B2
(45) Date of Patent: Nov. 11, 2014

(54) SEMICONDUCTOR DEVICE AND METHOD OF MANUFACTURING THE SAME

(75) Inventor: Masayasu Tanaka, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 202 days.

(21) Appl. No.: 13/592,628

(22) Filed: Aug. 23, 2012

(65) Prior Publication Data
US 2013/0062693 A1    Mar. 14, 2013

(30) Foreign Application Priority Data

Sep. 9, 2011    (JP) ................................. 2011-196809

(51) Int. Cl.
| H01L 29/78 | (2006.01) |
| H01L 29/66 | (2006.01) |
| H01L 29/778 | (2006.01) |
| H01L 29/423 | (2006.01) |
| H01L 29/40 | (2006.01) |
| H01L 29/20 | (2006.01) |

(52) U.S. Cl.
CPC ......... *H01L 29/7787* (2013.01); *H01L 29/2003* (2013.01); *H01L 29/7835* (2013.01); *H01L 29/66462* (2013.01); *H01L 29/66659* (2013.01); *H01L 29/42316* (2013.01); *H01L 29/404* (2013.01)
USPC .................................. 257/409; 257/E29.256

(58) Field of Classification Search
USPC ................................................. 257/340, 488
See application file for complete search history.

(56) References Cited

U.S. PATENT DOCUMENTS

| 6,107,160 | A * | 8/2000 | Hebert et al. ................. 257/340 |
| 7,256,432 | B2 | 8/2007 | Okamoto et al. |
| 7,573,078 | B2 * | 8/2009 | Wu et al. ........................ 257/194 |
| 7,800,131 | B2 * | 9/2010 | Miyamoto et al. ............ 257/192 |
| 7,973,335 | B2 | 7/2011 | Okamoto et al. |
| 2006/0175670 | A1 | 8/2006 | Tsubaki |

FOREIGN PATENT DOCUMENTS

| JP | 7-321312 A | 12/1995 |
| JP | 2004-200248 A | 7/2004 |
| JP | 2004-214471 A | 7/2004 |
| JP | 2006-253654 A | 9/2006 |
| JP | 2008-263140 A | 10/2008 |
| JP | 2011-71307 A | 4/2011 |

* cited by examiner

*Primary Examiner* — Chandra Chaudhari
(74) *Attorney, Agent, or Firm* — Miles & Stockbridge P.C.

(57) ABSTRACT

A semiconductor device which provides compactness and enhanced drain withstand voltage. The semiconductor device includes: a gate electrode; a source electrode spaced from the gate electrode; a drain electrode located opposite to the source electrode with respect to the gate electrode in a plan view and spaced from the gate electrode; at least one field plate electrode located between the gate and drain electrodes in a plan view, provided over the semiconductor substrate through an insulating film and spaced from the gate electrode, source electrode and drain electrode; and at least one field plate contact provided in the insulating film, coupling the field plate electrode to the semiconductor substrate. The field plate electrode extends from the field plate contact at least either toward the source electrode or toward the drain electrode in a plan view.

13 Claims, 20 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2011-196809 filed on Sep. 9, 2011 including the specification, drawings and abstract is incorporated herein by reference in its entirety.

BACKGROUND

The present invention relates to semiconductor devices and a method of manufacturing a semiconductor device.

In the field of semiconductor elements such as horizontal power MISFETs, there is demand for enhanced drain withstand voltage. Drain withstand voltage is evaluated according as whether there occurs characteristics variation or breakdown in a semiconductor element when a rated voltage is continuously applied to the drain electrode with gate voltage off. Characteristics variation or breakdown which occurs in a semiconductor element when a voltage is applied to the drain electrode is attributable to electric field concentration in the semiconductor element caused by the application of the drain voltage. Such electric field concentration easily occurs under the drain side end of the gate electrode.

Electric field concentration which occurs in the semiconductor element due to the application of drain voltage can be reduced, for example, by the use of a field plate electrode. Several techniques relating to semiconductor devices with field plate electrodes as described below have been known.

Japanese Unexamined Patent Publications No. 2011-71307 and No. 2004-200248 disclose that the gate electrode has an eave-like field plate portion. Japanese Unexamined Patent Publications No. 2006-253654, Hei 7 (1995)-321312, and 2008-263140 disclose that a field plate electrode located between a gate electrode and a drain electrode is coupled to a source electrode. Japanese Unexamined Patent Publication No. 2004-214471 discloses that an electric field control electrode located between a gate electrode and a drain electrode is controlled independently of the gate electrode.

SUMMARY

According to Japanese Unexamined Patent Publications No. 2011-71307, No. 2004-200248, No. 2006-253654, Hei 7 (1995)-321312, and 2008-263140, the field plate electrode is coupled to the source electrode or gate electrode. In this case, the field plate electrode has the same potential as the source electrode or gate electrode. For this reason, it is difficult to optimize the potential of the field plate electrode for the reduction of electric field concentration. According to Japanese Unexamined Patent Publication No. 2004-214471, the potential of the field plate electrode is controlled by an external power source which is independent of the gate electrode or source electrode. In this case, a pad or the like is needed to couple the field plate electrode to the external power source. This leads to an increase in the area of the semiconductor device.

According to one aspect of the present invention, there is provided a semiconductor device which includes: a semiconductor substrate; a gate electrode provided over the semiconductor substrate; a source electrode provided over the semiconductor-substrate and spaced from the gate electrode; a drain electrode located opposite to the source electrode with respect to the gate electrode in a plan view, provided over the semiconductor substrate and spaced from the gate electrode; at least one field plate electrode located between the gate electrode and the drain electrode in a plan view, provided over the semiconductor substrate through an insulating film and spaced from the gate, electrode, the source electrode and the drain electrode; and at least one field plate contact provided in the insulating film, coupling the field plate electrode to the semiconductor substrate. In a plan view, the field plate electrode extends from the field plate contact at least either toward the source electrode or toward the drain electrode.

According to the above aspect of the invention, the semiconductor device has a field plate electrode which is located between the gate electrode and drain electrode and coupled to the semiconductor substrate through a field plate contact. The field plate electrode extends from the field plate contact at least either toward the source electrode or toward the drain electrode. Due to this structure, the potential of the field plate electrode can be controlled according to the location of the field plate contact. Therefore, electric field concentration in the semiconductor substrate can be reduced effectively by giving an adequate potential to the field plate electrode. In addition, the field plate electrode is coupled to the semiconductor substrate. This means that a potential can be given to the field plate electrode without an external power source. Therefore, the semiconductor device can be, compact. Thus according to the present invention, the semiconductor device can be compact and provide enhanced drain withstand voltage.

According to another aspect of the invention, there is provided a method of manufacturing a semiconductor device which includes the steps of: forming an insulating film over a semiconductor substrate, and forming, over the insulating film, a source electrode and a drain electrode located on both sides of a gate electrode, and a field plate electrode between the gate electrode and the drain electrode and fOrming, in the insulating film, a field plate contact to couple the field plate electrode to the semiconductor substrate. At the step of forming the field plate electrode, the field plate electrode is formed so as to extend from the field plate contact at least either toward the source electrode or toward the drain electrode in a plan view.

According to the present invention, the semiconductor device can be compact and provide enhanced-drain withstand voltage.

BRIEF DESCRIPTION OF THE DRAWINGS

FIGS. 4A and 4B are graphs showing electric potential distribution and electric field distribution in the case of voltage application to the drain electrode of the semiconductor device shown in FIG. 1, in which FIG. 4A shows electric potential distribution and FIG. 4B shows electric field distribution;

FIGS. 8A and 8B are sectional views showing a method of manufacturing the semiconductor device shown in FIG. 1, in which FIG. 8A shows a semiconductor substrate and FIG. 8B shows the formation of an insulating film and a conductive film;

FIGS. 9A and 9B are sectional views showing the method of manufacturing the semiconductor device shown in FIG. 1, in which FIG. 9A shows the formation of contact holes and FIG. 9B shows a process including the formation of contacts in the contact holes;

FIGS. 11A and 11B are sectional views showing the method of manufacturing the semiconductor device shown in FIG. 10, in which FIG. 11A shows the formation of source, drain and LDD regions and FIG. 11B shows the formation of an insulating film and a conductive film;

FIGS. 12A and 12B are sectional views showing the method of manufacturing the semiconductor device shown in FIG. 10, in which FIG. 12A shows the formation of contact holes and FIG. 12B shows a process for forming electrodes;

FIGS. 14A and 14B are sectional views showing the method of manufacturing the semiconductor device shown in FIG. 13, in which FIG. 14A shows a semiconductor substrate and FIG. 14B shows the formation of an insulating film and a conductive film;

FIGS. 15A and 15B are sectional views showing the method of manufacturing the semiconductor device shown in FIG. 13, in which FIG. 15A shows a process including the formation of a gate electrode and FIG. 15B shows a process including the formation of contact holes;

FIGS. 17A and 17B are sectional views showing the method of manufacturing the semiconductor device shown in FIG. 16, in which FIG. 17A shows the formation of a drain region, a source region and an LDD region and FIG. 17B shows the formation of an insulating film and a conductive film;

FIGS. 18A and 18B are sectional views showing the method of manufacturing the semiconductor device shown in FIG. 16, in which FIG. 18A shows a process including the formation of a gate electrode and FIG. 18B shows a process for forming drain, source and field plate electrodes;

FIGS. 20A and 20B are sectional views showing the method of manufacturing the semiconductor device shown in FIG. 19, in which FIG. 20A shows the formation of an insulating film and a conductive film and FIG. 20B shows the formation of a gate electrode;

FIGS. 21A and 21B are sectional views showing the method of manufacturing the semiconductor device shown in FIG. 19, in which FIG. 21A shows the formation of an LDD region and FIG. 21B shows the formation of a drain region and a source region; and FIGS. 22A and 22B are sectional views showing the method of manufacturing the semiconductor device shown in FIG. 19, in which FIG. 22A shows the formation of an interlayer insulating film and FIG. 22B shows a process for forming a drain electrode, a source electrode and field plate electrodes.

DETAILED DESCRIPTION

Figure 1:
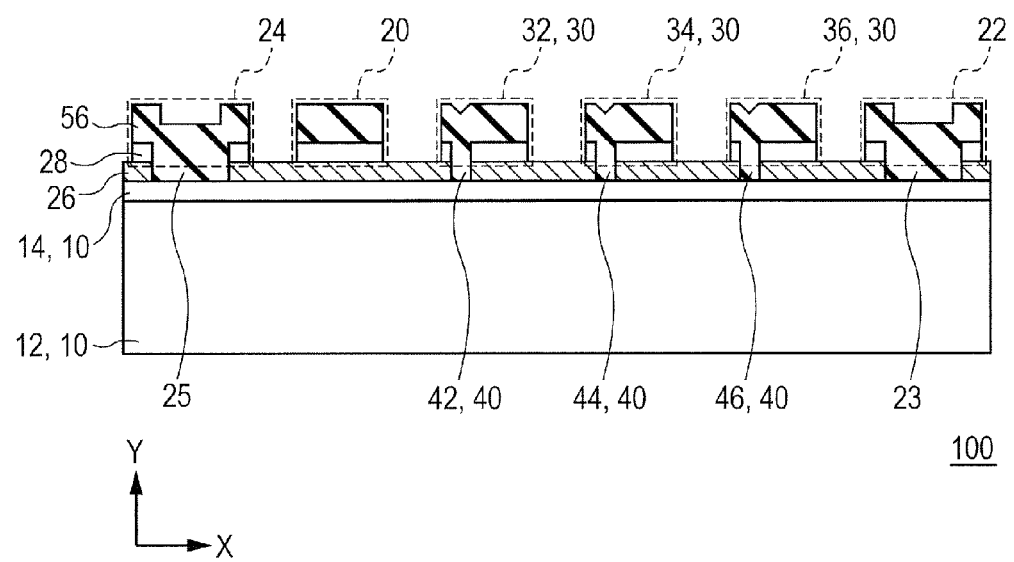
FIG. 1 is a sectional view of a semiconductor device according to a first embodiment of the invention.

Next, the preferred embodiments of the present invention will be described referring to the accompanying drawings. In the drawings, like elements are designated by like reference numerals and descriptions of such elements are not repeated.

FIG. 1 is a sectional view of a semiconductor device 100 according to a first embodiment of the invention. The semiconductor device 100 includes a semiconductor substrate 10, a gate electrode 20, a source electrode 24, a drain electrode 22, at least one field plate electrode 30, and at least one field plate contact 40. The semiconductor device 100 in this embodiment includes, for example, a high electron mobility transistor (HEMT).

The gate electrode 20 is arranged over the semiconductor substrate 10. The source electrode 24 is arranged over the semiconductor substrate 10. The source electrode 24 is spaced from the gate electrode 20. The drain electrode 22 is located opposite to the source electrode 24 with respect to the gate electrode 20 in a plan view. The drain electrode 22 is arranged over the semiconductor substrate 10. The drain electrode 22 is spaced from the gate electrode 20.

The field plate electrode 30 is located between the gate electrode 20 and drain electrode 22 in a plan view. Also the field plate electrode 30 is located over the semiconductor substrate 10 through an insulating film 26. The field plate electrode 30 is spaced from the gate electrode 20, source electrode 24, and drain electrode 22. The field plate contact 40 is arranged in the insulating film 26. The field plate contact 40 couples the field plate electrode 30 to the semiconductor substrate 10. In a plan view, the field plate electrode 30 extends from the field plate contact 40 at least either toward the source electrode 24 or toward the drain electrode 22. Next, the structure of the semiconductor device 100 will be described in detail.

As shown in FIG. 1, the insulating film 26 is arranged in a way to cover one surface of the semiconductor substrate 10. The insulating film 26 is arranged under the gate electrode 20. The insulating film 20's portion which is arranged under the gate electrode 20 functions as a gate insulating film. The insulating film 26 is, for example, a single-layer film such as a silicon nitride film, silicon oxide film or alumina film or a laminated film as a combination of these.

As shown in FIG. 1, the field plate electrode 30 is located between the gate electrode 20 and drain electrode 22 in a plan view. The field plate electrode 30 is spaced from the gate electrode 20, drain electrode 22, and source electrode 24. A plurality of field plate electrodes 30 are provided and they are spaced from each other in the first direction from the gate electrode 20 toward the drain electrode 22. In this embodiment, three field plate electrodes 30 are provided between the gate electrode 20 and drain electrode 22. The number of field plate electrodes 30 can be selected as appropriate. Here, the field plate electrodes 30 are referred to as field plate electrode 32 (30), field plate electrode 34 (30) and field plate electrode 36 (30) in order in the direction from the gate electrode 20 toward the drain electrode 22. The first direction corresponds to the direction from the left to the right in FIG. 1.

The field plate electrodes 30 are coupled to the semiconductor substrate 10 through field plate contacts 40. A field plate contact 40 is provided on every field plate electrode 30. Specifically, the field plate electrode 32 is coupled to the semiconductor substrate 10 through the field plate contact (40), the field plate electrode 34 is coupled to the semiconductor substrate 10 through the field plate contact 44 (40), and the field plate electrode 36 is coupled to the semiconductor substrate 10 through the field plate contact 46 (40).

As shown in FIG. 1, each field plate electrode 30 extends from a field plate contact 40 toward the drain electrode 22 in a plan view. The field plate electrodes 30 extend in the same direction from the respective field plate contacts 40 coupled to the field plate electrodes 30. Specifically, the field plate electrodes 30 extend from the respective field plate contacts 40 coupled to the field plate electrodes 30 toward the drain electrode 22.

The field plate electrodes 30 extend in one direction (X direction in FIG. 1) as seen from the field plate contacts 40. A depleted layer is produced in a portion of the semiconductor substrate 10 under an end of each field plate electrode 30 in that direction. Therefore, a region where electric field concentration occurs is generated in the portion of the semiconductor substrate 10 under the end of each field plate electrode 30 in that direction. Specifically, in this embodiment, a region where electric field concentration occurs is generated in the portion of the semiconductor substrate 10 under each field plate electrode 30's end nearer to the drain electrode 22. This means that electric field concentration under the gate electrode 20's end nearer to the drain electrode 22 is dispersed to the regions under the field plate electrodes 30's ends nearer to the drain electrode 22. Therefore, electric field concentration in the semiconductor substrate 10 is reduced.

The field plate electrodes 30 extend in one direction from the respective field plate contacts 40 coupled to the field plate electrodes 30. The intervals between ends of the field plate electrodes 30 in that direction are equal to each other. This Contributes to effective dispersion of the electric field concentration in the semiconductor substrate 10.

The field plate electrodes 30 and the field plate contacts 40 each provided on each of the field plate electrodes 30 are arranged so that when a voltage is applied to the drain electrode 22 with gate voltage off, the potentials applied to the drain electrode 22, gate electrode 20, and field plate electrodes 30 vary with a linear gradient from the drain electrode 22 to the gate electrode 20. Consequently, electric field concentration in the semiconductor substrate 10 can be effectively suppressed. The locations of the field plate contacts 40 are determined by calculating the potential distribution of the surface of the semiconductor substrate 10, for example, using a 2D device simulator based on the finite element method.

Figure 4A:
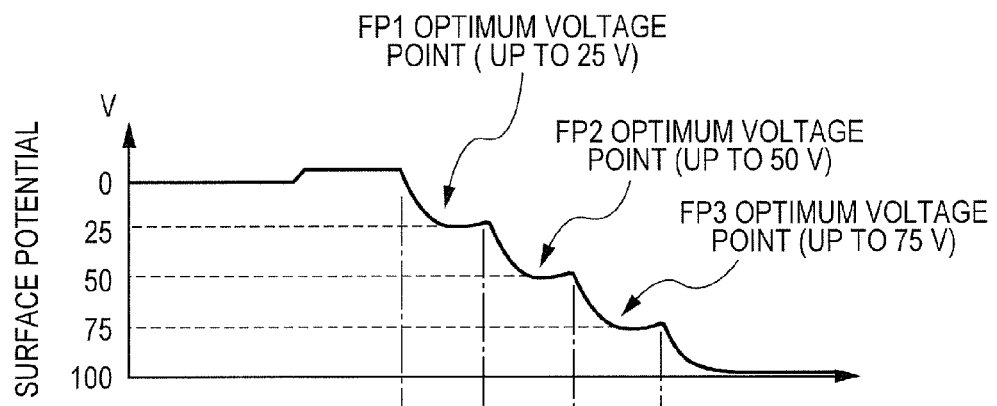
Figure 4B:
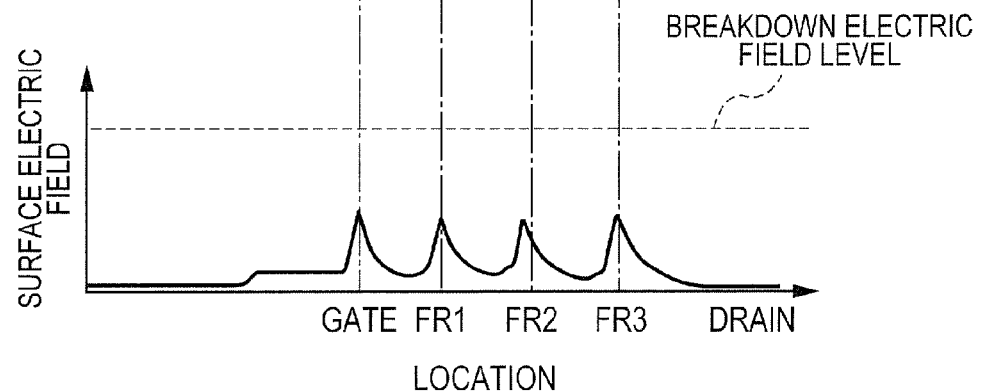

FIGS. 4A and 4B are graphs showing electric potential distribution and electric field distribution in the case of voltage application to the drain electrode 22 of the semiconductor device 100 shown in FIG. 1 respectively. FIG. 4A shows the potentials of the gate electrode 20, field plate electrodes 30, and drain electrode 22. FP1, FP2, and FP3 in FIG. 4A represent the field plate electrode 32, field plate electrode 34, and field plate electrode 36 in FIG. 1 respectively: FIG. 4B shows the electric field distribution on the surface of the semiconductor substrate 10. FIG. 4A shows the electric field distribution when 100 V is applied to the drain electrode 22 while the gate voltage is off (0 V). In this case, as shown in FIG. 4A, the potential of the field plate electrode 32 is 25 V, the potential of the field plate electrode 34 is 50 V, and the potential of the field plate electrode 36 is 75 V. In other words, among the potentials of the drain electrode 22, field plate electrodes 30, and gate electrode 20, there is a decrease with a linear gradient from the drain electrode 22 to the gate electrode 20. In this case, the electric field on the surface of the semiconductor substrate 10 is evenly dispersed to under the gate electrode 20's end nearer to the drain electrode 22 and under the ends of the field plate electrodes 30 nearer to the drain electrode 22, as shown in FIG. 4B. In this case, as shown in FIG. 4B, the value of the surface electric field of the semiconductor substrate 10 is lower than the breakdown electric field level at which breakdown or the like occurs in the semiconductor element. From the above it is known that when the voltages applied to the drain electrode 22, gate electrode 20 and field plate electrodes 30 vary linearly from the drain electrode 22 to the gate electrode 20, the electric field concentration which occurs in the semiconductor substrate 10 can be effectively dispersed.

Figure 5:
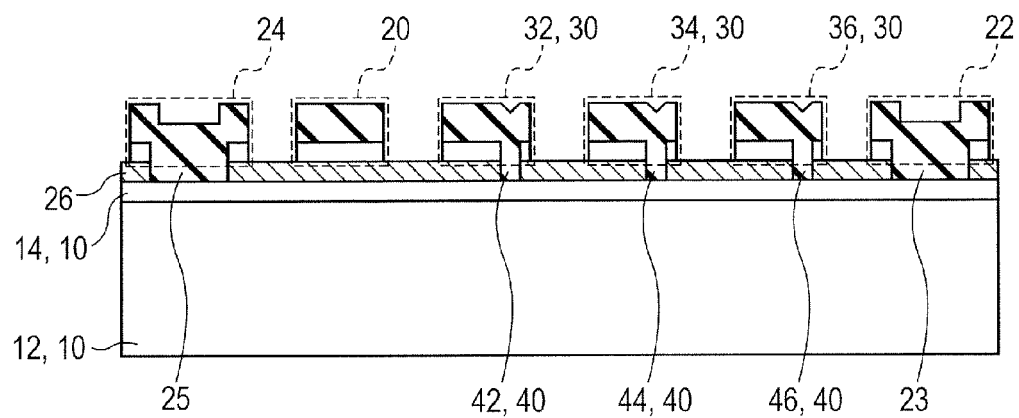
FIG. 5 is a sectional view showing a first variation of the semiconductor device shown in FIG. 1.

FIG. 5 is a sectional view showing a first variation of the semiconductor device 100 shown in FIG. 1. As shown in FIG. 5, the field plate electrodes 30 may extend from the field plate contacts 40 toward the source electrode 24 in a plan view. In this case, carriers concentrate in portions of the semiconductor substrate 10 under the ends of the field plate electrodes 30 nearer to the source electrode 24. A depleted layer is generated around the portions where carriers concentrate. Therefore, electric field concentration occurs around the portions of the semiconductor substrate 10 under the ends of the field plate electrodes 30 nearer to the source electrode 24. Consequently, electric field concentration which occurs in the semiconductor substrate 10 is reduced. Furthermore, the field plate electrodes 30 extend in the same direction from the respective field plate contacts 40 coupled to the field plate electrodes 30. In other words, the field plate electrodes 30 extend toward the source electrode 24 from the respective field plate contacts 40 coupled to the field plate electrodes 30.

It is also possible that some field plate electrodes 30 extend from the respective field plate contacts 40 toward the drain electrode 22 and the other field plate electrodes 30 extend from the respective field plate contacts 40 toward the source electrode 24. Another possible approach is that the field plate electrodes 30 extend from the field plate contacts 40 both toward the source electrode 24 and drain electrode 22.

As shown in FIG. 1, the gate electrode 20 is arranged over the insulating film 26. The source electrode 24 is arranged over the insulating film 26. The source electrode 24 is coupled to the semiconductor substrate 10 through a source contact 25 provided in the insulating film 24. The drain electrode 22 is arranged over the insulating film 26. The drain electrode 22 is coupled to a drain contact 23 provided in the insulating film 26.

As shown in FIG. 1, the field plate electrodes 30 and the gate electrode 20 both are arranged over the insulating film 26. When a field plate electrode is coupled to a gate electrode, the field plate electrode has the same potential as the gate electrode. Also, the field plate electrode is nearer to the drain electrode than to the gate electrode. In this case, the field plate electrode is more easily influenced by the voltage applied to the drain electrode than by the voltage applied to the gate electrode. For this reason, the insulating film under the field plate electrode must be thicker than the gate insulating film. This means that it is necessary to add a new manufacturing step to form an insulating film under the field plate electrode. On the other hand, in this embodiment, the field plate electrodes 30 are coupled to the semiconductor substrate 10 but not coupled to the gate electrode 20. Therefore, the insulating film under the field plate electrodes 30 and the gate insulating film under the gate electrode 20 can be the same insulating film 26. This means that it is not necessary to add a new manufacturing step to form the insulating film under the field plate electrodes 30. Therefore, the field plate electrodes 30 are formed more easily.

The gate electrode 20, source electrode 24, drain electrode 22, and field plate electrodes 30 are laminated bodies made by stacking, for example, a conductive film 28 and conductive film 56 over the insulating film 26 in order. As shown in FIG. 1, the conductive film 56 as the upper layer of the source electrode 24 is buried in the opening made in the conductive film 28 and insulating film 26 and coupled to the semiconductor substrate 10. The source contact 25 is made of the conductive film 56 buried in the insulating film 26. The conductive film 56 as the upper layer of the drain electrode 22 is buried in the opening made in the conductive film 28 and insulating film 26 and coupled to the semiconductor substrate 10. The drain contact 23 is made of the conductive film 56 buried in the insulating film 26. The conductive film 56 as the upper layer of each field, plate electrode 30 is buried in the opening made in the conductive film 28 and insulating film 26 and coupled to the semiconductor substrate 10. The field plate contact 40 is made of the conductive film 56 buried in the insulating film 26.

The conductive film 28 is made of a material suitable for the gate electrode. The conductive film 28 is, for example, an Al, Ti, TiN, W, WSi, or polycrystalline Silicon film. When the gate electrode 20's portion in contact with the insulating film 26 which functions as the gate insulating film is the conductive film 28 made of any of these materials, it is easy to control the semiconductor element threshold voltage. The conductive film 56 is made of a material suitable for the source electrode and drain electrode. The conductive film 56 is, for example, a single-layer film of Al or a laminated film of Ti and Al. The contact resistance of the drain electrode 22, source electrode 24, and field plate electrodes 30 with the semiconductor substrate 10 can be reduced by the use of the conductive film 56 made of such material.

Figure 2:
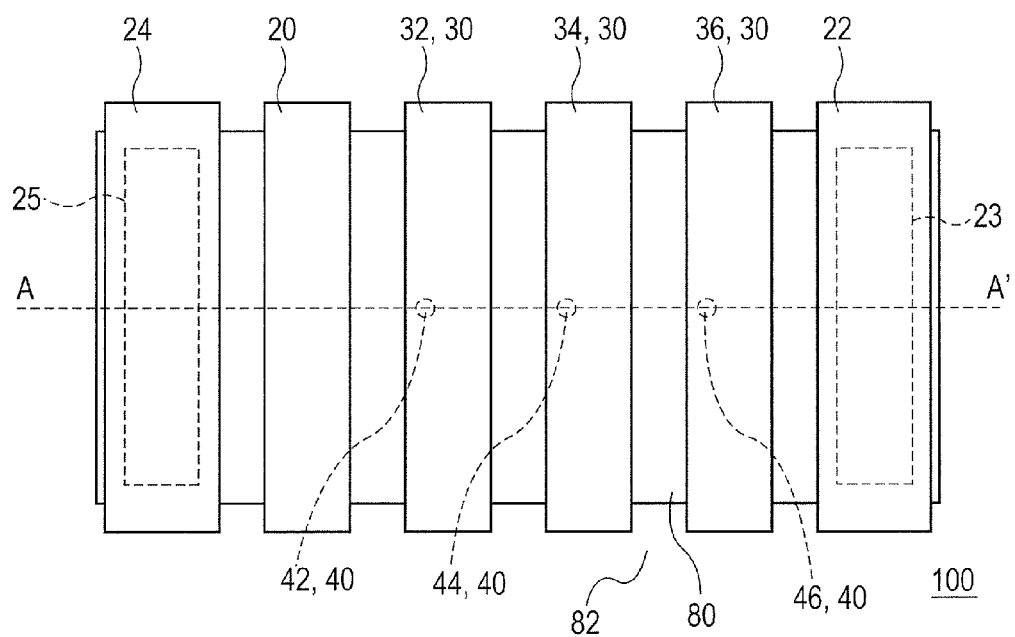
FIG. 2 is a plan view showing an example of the semiconductor device shown in FIG. 1.
Figure 3:
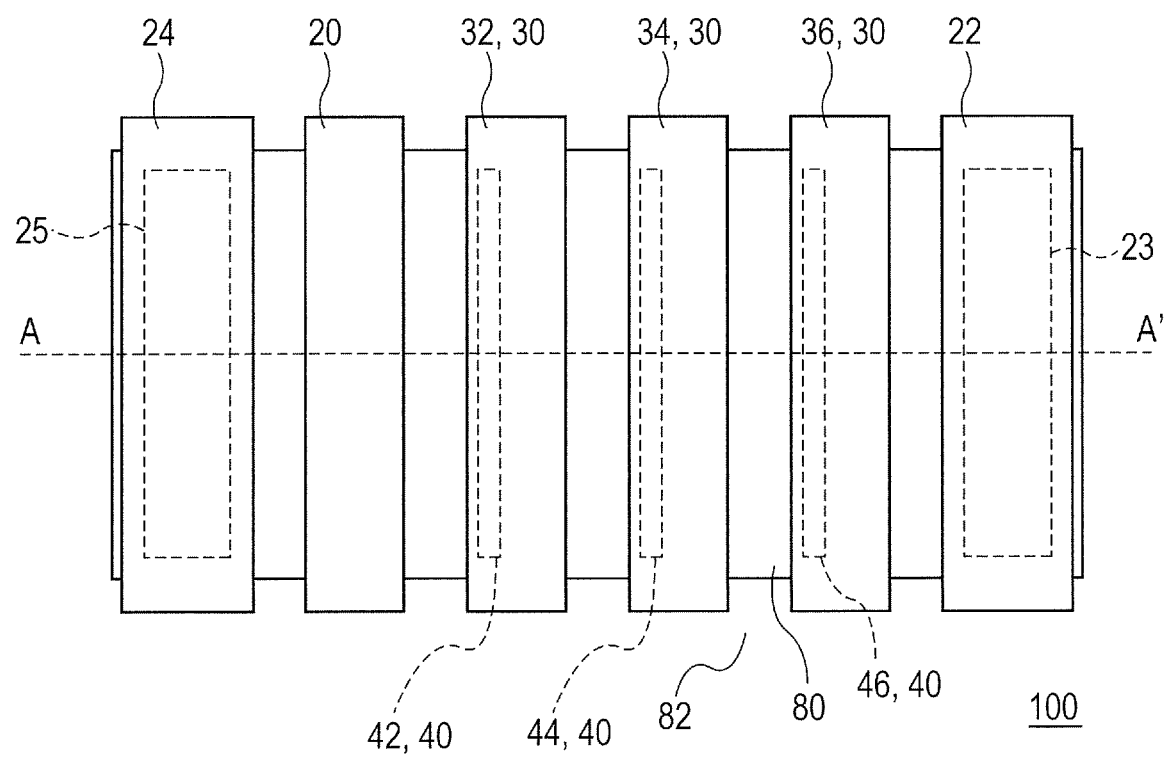
FIG. 3 is a plan view showing an example of the semiconductor device shown in FIG. 1.

FIGS. 2 and 3 are plan views showing examples of the semiconductor device 100 shown in FIG. 1, FIG. 1 is a sectional view taken along the line A-A' in FIGS. 2 and 3. As shown in FIGS. 2 and 3, the semiconductor device 100 includes an element region where a semiconductor element is formed, and an element isolation region 82 formed around the element region 80. The element region 80 is isolated from another element region 80 by the element isolation region 82.

As shown in FIG. 2, each field plate contact 40 may be located in a portion of the field plate electrode 30 in a second direction perpendicular to the above first direction in the plane of the semiconductor substrate 1 and shaped like a contact hole. A plurality of field plate contacts 40 each shaped like a contact hole may be formed on a basis of one contact 40 per field plate electrode 30. If that is the case, the field plate contacts 40 each provided on each of the field plate electrodes 30 may be arranged in the second direction and spaced from each other. The field plate contacts 40 provided on the field plate electrodes 30 may be staggered from each other in the second direction. Alternatively, as shown in FIG. 3, the field plate contacts 40 may be shaped like a slit extending in the second direction. The second direction corresponds to the vertical direction in FIG. 2.

As shown in FIG. 1, the semiconductor substrate 10 is a laminated body made by stacking a semiconductor layer 12 and a semiconductor layer 14 in order. The semiconductor layer 14 is deposited over the semiconductor layer 12 by the heteroepitaxial growth method. A two-dimensional electron gas layer is formed in the hetero-interface between, the semiconductor layer 14 and semiconductor layer 12. This means that the semiconductor device 100 according to this embodiment has a high electron mobility transistor which uses the two-dimensional electron gas layer as the channel.

The semiconductor substrate 10 is made of, for example, a nitride semiconductor. In this case, for example, the semiconductor layer 12 is made of AlGaN and the semiconductor layer 14 is made of GaN. It is also possible that the semiconductor layer 12 is made of InAlGaN and the semiconductor layer 14 is made of GaN. Furthermore, it is also possible that the semiconductor layer 12 is made of AlN and the semiconductor layer 14 is made of GaN. Alternatively, the semiconductor substrate 10 may be a laminated body made by stacking three different types of semiconductor layers. In that case, the semiconductor substrate 10 may be a laminated body made by stacking AlGaN, GaN and AlGaN layers in order or GaN, AlGaN and GaN layers in order. Alternatively the semiconductor substrate 10 may be made of a material other than nitride semiconductor. In that case, for example, the semiconductor layer 12 is made of AlGaAs and the semiconductor layer 14 is made of GaAs. It is also possible that the semiconductor layer 12 is made of AlGaAs and the semiconductor layer 14 is made of. $In_xGaAs$. Furthermore it is also possible that the semiconductor layer 12 is made of InAlAs and the semiconductor-layer 14 is made of InGaAs.

Figure 6:
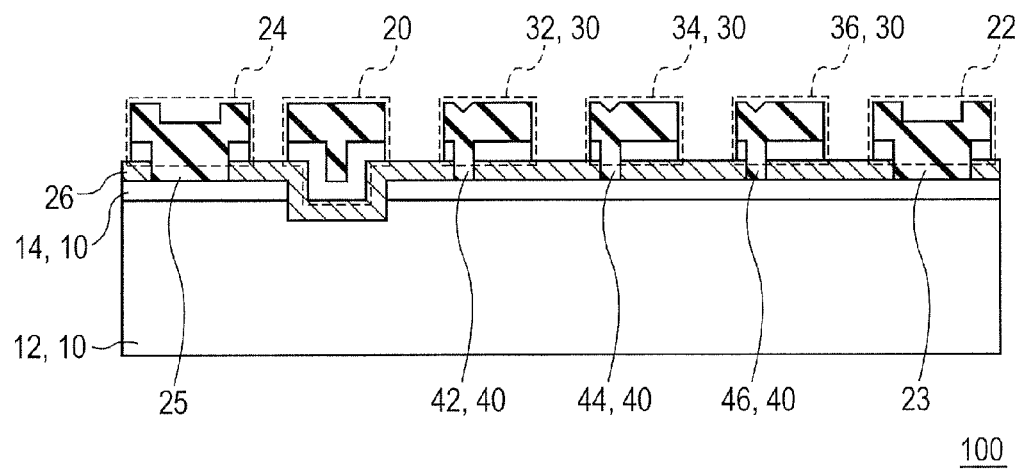
FIG. 6 is a sectional view showing a second variation of the semiconductor device shown in FIG. 1.

FIG. 6 is a sectional view showing a second variation of the semiconductor device 100 shown in FIG. 1. As shown in FIG. 6, the semiconductor layer 14 may have an opening under the gate electrode 20. In this case, the opening in the semiconductor layer 14 is filled by the insulating film 26, conductive film 28, and conductive film 56 which are arranged over the semiconductor substrate. The insulating film 26 is in contact with the semiconductor layer 12. Due to the opening in the semiconductor layer 14 under the gate electrode 20, the semiconductor element threshold voltage can be 0 V or more. This means that a normally off semiconductor device can be realized.

Figure 7:
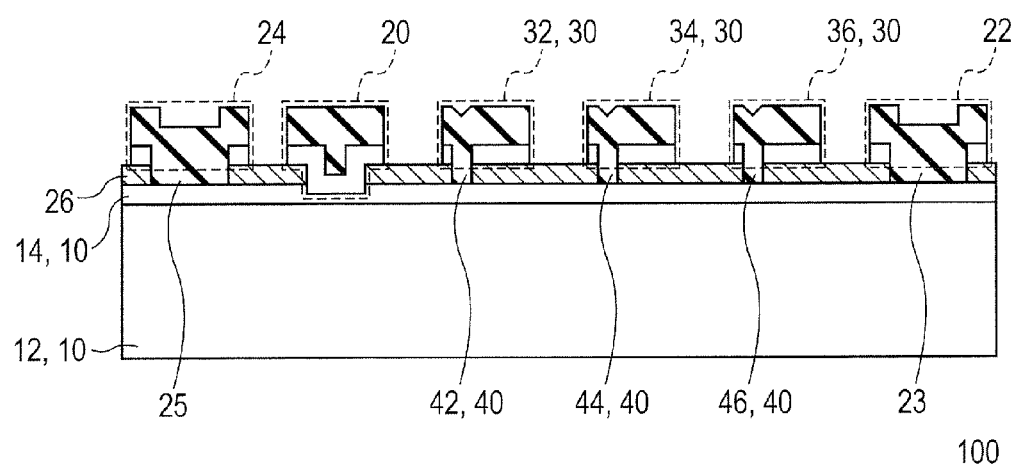
FIG. 7 is a sectional view showing a third variation of the semiconductor device shown in FIG. 1.

FIG. 7 is a sectional view showing a third variation of the semiconductor device 100 shown in FIG. 1. As shown in FIG. 7, the semiconductor substrate 10 may have a recess structure. The recess structure has a concave or recess which does not penetrate the semiconductor layer 14, in the semiconductor layer 14 under the gate electrode 20. In this case, an opening is made in the insulating film 26 under the gate electrode 20. The opening in the insulating film 26 and the recess in the semiconductor layer 14 are filled by the conductive film 28 and conductive film 56. The recess structure makes it possible to control the semiconductor element threshold voltage. In addition, a low-loss semiconductor element can be realized by using the two-dimensional electron gas layer as a channel.

Next, a method of manufacturing the semiconductor device 100 according to this embodiment will be described. FIGS. 8A and 8B and FIGS. 9A and 9B are sectional views showing the method of manufacturing the semiconductor device 100 shown in FIG. 1. The method includes the step of forming the insulating film 26 over the semiconductor substrate 10 and the step of forming the source electrode 24, drain electrode 22, and field plate electrodes 30 over the insulating film 26 and forming the field plate contacts 40 in the insulating film 26 to couple the field plate electrodes 30 to the semiconductor substrate 10.

Figure 8A:
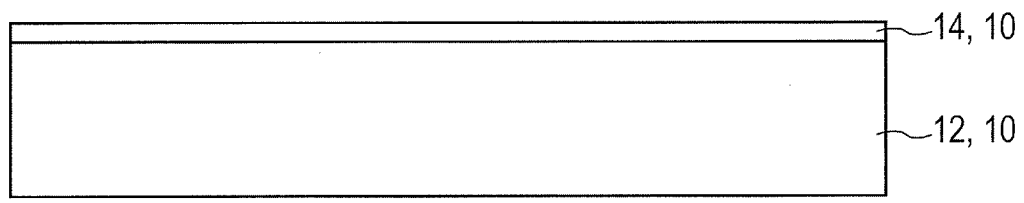

First, the semiconductor substrate 10 is prepared as shown in FIG. 8A. The semiconductor substrate 10 is configured of the semiconductor layer 12 and the semiconductor layer 14 deposited over the semiconductor layer 12 by the heteroepitaxial growth method. Consequently a two-dimensional electron gas layer is formed in the hetero-interface between the semiconductor layer 14 and semiconductor layer 12.

Next, the element region 80 (FIG. 2) and element isolation region 82 (FIG. 2) are formed in the semiconductor substrate 10. The following procedure is taken to form the element region 80 and element isolation region 82. First, a resist film is formed in an area which is to be an element region 80. Then, ions are implanted using the resist film as a mask. Impurities such as nitrogen ions or boron ions are used in this ion implantation process. In the ion implantation process, impurities are introduced into a region at a larger depth than the interface between the semiconductor layers 14 and 12. As a result of the ion implantation process, the two-dimensional electron gas layer in the element isolation region 82 disappears. This electrically isolates the element region 80 from another element region 80.

Figure 8B:
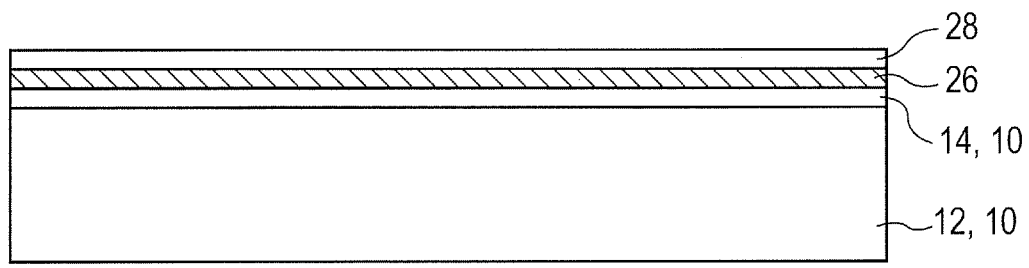

Next, the surface of the semiconductor substrate 10 is cleaned with an alkaline or acidic chemical. By cleaning, particles or contaminants such as metal and organic substances on the surface of the semiconductor substrate 10 are removed. Next, the insulating film 26 is formed over the semiconductor substrate 10 as shown in FIG. 8B. The insulating film 26 is formed, for example, by a CVD (Chemical Vapor Deposition) process in which a single-layer film of silicon nitride, silicon oxide or alumina or a laminated film as a combination of these is deposited. Then, as shown in FIG. 8B, the conductive film 28 is formed over the insulating film 26. The conductive film 28 is formed, for example, by a PVD (Physical Vapor Deposition) process in which a metal film is deposited. Alternatively the conductive film 28 may be formed by depositing a polycrystalline silicon film by a CVD process.

Figure 9A:
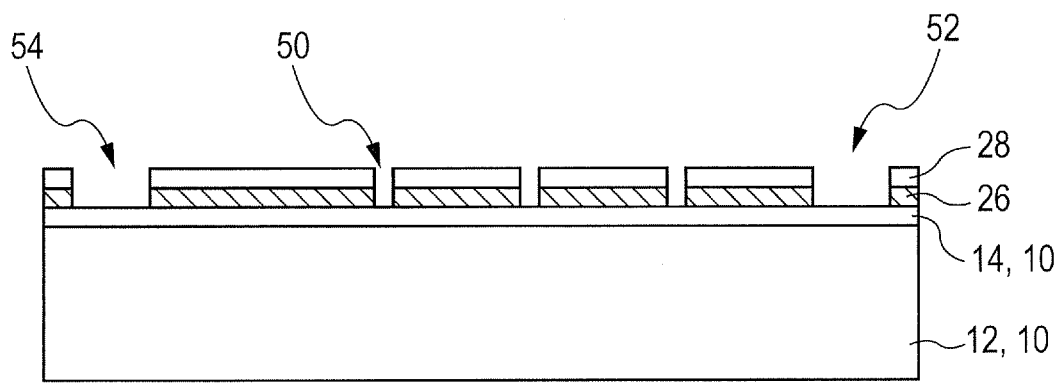

Next, field plate contact holes 50, a drain contact hole 52, and a source contact hole 54 are formed in the insulating film 26 and conductive film 28 as shown in FIG. 9A. The following procedure is taken to form the field plate contact holes 50, drain contact hole 52, and source contact hole 54. First, resist film is formed over the conductive film 28. Then, resist pattern is made by exposure and development of the resist film. Then, the insulating film 26 and conductive film 28 are dry-etched using the resist pattern as a mask. For example, fluorinated gas may be used as the etching gas. Then, ashing of the resist pattern is done using oxygen plasma. Then, the resist pattern is peeled and removed by an acid solution. As a consequence, the field plate contact holes 50, drain contact hole 52, and source contact hole 54 are completed. The field plate contact holes 50 are formed between the drain contact hole 52 and source contact hole 54. Also the field plate contact holes 50 are formed so as to be arranged between the gate electrode 20 and drain electrode 22 which will be formed in a later process.

Figure 9B:
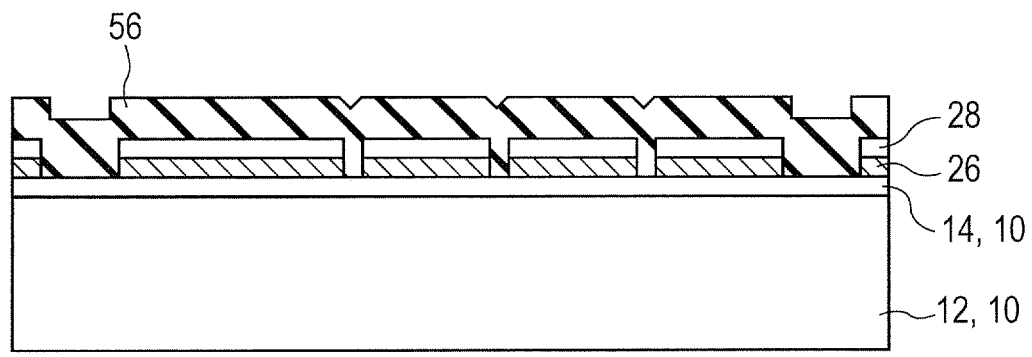

Next, as shown in FIG. 9B, the conductive film 56 is formed inside the field plate contact holes 50, drain contact hole 52, and source contact hole 54 and over the conductive film 28. The conductive film 56 buried in the field plate contact holes 50 forms the field plate contacts 40. The conductive film 56 buried in the drain contact hole 52 forms the drain contact 23. The conductive film 56 buried in the source contact hole 54 forms the source contact 25.

The conductive film 56 is formed by a PVD process in which a single-layer film of Al or a laminated film of Ti and Al is deposited. If the conductive film 56 is a laminated film of Ti and Al, the following procedure is taken to form the conductive film 56 as an example. First, Ti is deposited over the semiconductor substrate 10 placed in an ultra-high vacuum sputter chamber by sputtering. Then, the semiconductor substrate 10 is moved into an anneal chamber while the super-high vacuum is maintained. Then, the semiconductor substrate 10 placed in the anneal chamber is heated at 700 to 800° C. for about five minutes. While the super-high vacuum is maintained, the semiconductor substrate 10 is moved back into the sputter chamber. Then Al is deposited over the semiconductor substrate 10 placed in the sputter chamber by sputtering. At this time, the thickness of the Ti film is, for example, about 5 nm. The thickness of the Al film is, for example, about 1 μm. The contact resistance of the drain electrode 22, source electrode 24, and field plate electrodes 30 with the semiconductor substrate 10 can be reduced by maintaining the super-high vacuum in this process for forming the conductive film 56. However, even if the super-high vacuum is not maintained in the process for forming the conductive film 56, the advantageous effects of the present invention will be brought about.

Next, the gate electrode 20, drain electrode 22, source electrode 24, and field plate contacts 40 are formed simultaneously. For example, the following procedure is taken to form the gate electrode 20, drain electrode 22, source electrode 24, and field plate contacts 40. First, a resist film is formed over the conductive film 56. Then, a resist pattern is made by exposure and development of the resist film. Then, the conductive film 56 is dry-etched using the resist pattern as a mask. For example, chlorine gas may be used as the etching gas. Then, ashing of the resist pattern is done using oxygen plasma. Then, the resist pattern is peeled and removed by an acid solution. As a consequence, the gate electrode 20, drain electrode 22, and source electrode 24, and field plate contacts 40 are completed. The semiconductor device 100 shown in FIG. 1 is thus completed.

Next, the effects of this embodiment will be described. This embodiment includes the field plate electrodes 30 which are located between the gate electrode 20 and drain electrode 22 and coupled to the semiconductor substrate 10 through the field plate contacts 40. The field plate electrodes 30 extend from the field plate contacts 40 at least either toward the source electrode 24 or toward the drain electrode 22.

According to this embodiment, the potential of each field plate electrodes 30 can be controlled according to the location of the field plate contact 40. This means that it is possible to reduce electric field concentration in the semiconductor substrate 10 effectively by giving an adequate potential to the field plate electrode 30. In addition, since the field plate electrode 30 is coupled to the semiconductor substrate 10, a potential can be given to the field plate electrode 30 without an external power source. This eliminates the need for an external power source for controlling the field plate electrode 30 and also the need for a packaging pin or pad for a power line used in coupling with an external power source. Therefore, it is possible to avoid an increase in the area of the semiconductor device 100. Therefore, according to this embodiment, the semiconductor device can be compact and provide enhanced drain withstand voltage.

Furthermore, since there is no need for an external power source, even if an external power source cannot be installed due to circuit-related restrictions, a field plate electrode 30 can be provided to enhance the drain withstand voltage. If the field plate electrode 30 is electrically floating, charge writing may occur on the field plate electrode 30, causing the semiconductor element to operate, unstably. In this embodiment, the field plate electrode 30 is coupled to the semiconductor substrate 10. This prevents the field plate electrode 30 from becoming electrically floating, which reduces the possibility of unstable operation of the element.

In addition, according to this embodiment, the field plate electrodes 30 are formed simultaneously with the drain electrode 22 and source electrode 24. This means that it is not necessary to add a new step of forming the field plate electrodes 30. Therefore, it is easy to produce the field plate electrodes 30.

According to the techniques disclosed in Japanese Unexamined Patent Publications No. 2011-71307, No. 2004-200248, No. 2006-253654, Hei 7 (1995)-321312, and 2008-263140, the field plate electrode is coupled to the source electrode or formed integrally with the gate electrode. Therefore, the field plate electrode has the same potential as the gate electrode or source electrode. The optimum electric field reduction in each region of the semiconductor substrate depends on the distance from the gate electrode. Therefore, if the field plate electrode has the same potential as the gate electrode or source electrode, in order to achieve the optimum electric field reduction in each region of the semiconductor substrate, the insulating film under the field plate electrode must have different thicknesses in different regions as described in Japanese Unexamined Patent Publication No. 2004-200248. If different thicknesses of insulating film are to be made in different regions, the number of manufacturing steps should be increased.

On the other hand, according to this embodiment, the potential of each of the field plate electrodes 30 can be controlled individually according to the location of the corresponding field plate contact 40. In other words, a potential to optimize the electric field reduction in each region of the semiconductor substrate 10 can be given to each field plate electrode 30. Consequently the optimum electric field reduction can be achieved in each region of the semiconductor substrate 10. Therefore, the insulating films lying under the field plate electrodes 30 can have the same thickness. This makes it easy to produce the field plate electrodes 30.

Furthermore, according to this embodiment, each field plate electrode 30 is coupled to the semiconductor substrate 10 but not coupled to the gate electrode 20. For this reason, the gate fringing capacitance is less likely to increase than when the field plate electrode 30 is coupled to the gate electrode 20. Consequently, high speed can be achieved in the operation of the semiconductor device.

Figure 10:
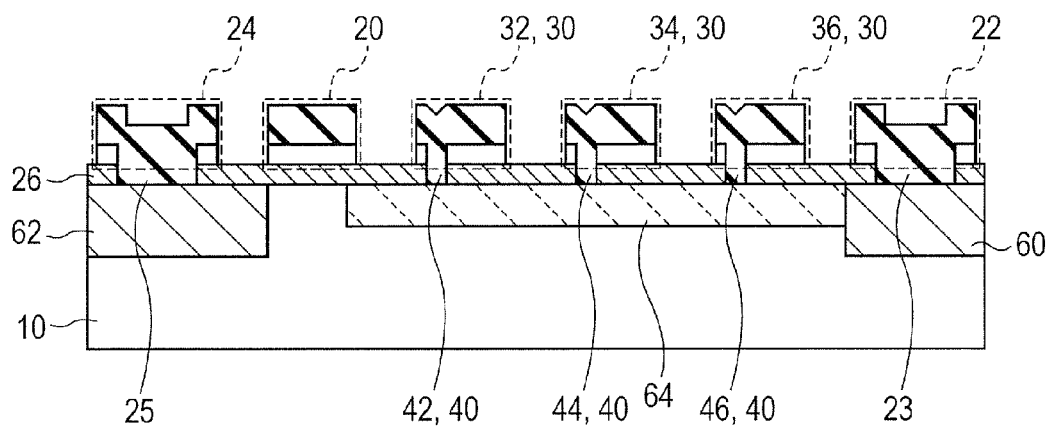
FIG. 10 is a sectional view showing a semiconductor device according to a second embodiment of the invention.

FIG. 10 is a sectional view showing a semiconductor device 102 according to a second embodiment of the invention, which corresponds to FIG. 1 for the first embodiment. The semiconductor device 102 according to the second embodiment is structurally the same as the semiconductor device 100 according to the first embodiment except the structure of the semiconductor substrate 10.

As shown in FIG. 10, the semiconductor substrate 10 of the semiconductor device 102 includes a drain region 60, a source region 62, and an LDD region 64. The drain region 60 and source region 62 are located on both sides of the gate electrode 20 in the semiconductor substrate 10 in a plan view. The LDD region 64 is located between the gate electrode 20 and drain electrode 22 in the semiconductor substrate 10 in a plan view. In this specification, the semiconductor substrate is conceived as including a source region, a drain region, and an LDD region.

The semiconductor substrate 10 is, for example, made of GaN or Si. For the formation of an n-type MISFET as a semiconductor element, for example, a p-type GaN substrate or undoped substrate is used as the semiconductor substrate 10. Here, undoped substrates include n-type substrates with a carrier concentration of $5 \times 10^{17}$ cm$^{-3}$ or less.

The junction depth of the LDD region 64 is shallower than the junction depth of the drain region 60 and source region 62. The impurity concentration of the LDD region 64 is lower than the impurity concentrations of the drain region 60 and source region 62. Consequently the drain withstand voltage is enhanced when a drain voltage is applied. As shown in FIG. 10, the drain electrode 22 is coupled to the drain region 60. Also the source electrode 24 is coupled to the source region 62. The field plate electrodes 30 are coupled to the LDD region 64.

Figure 11A:
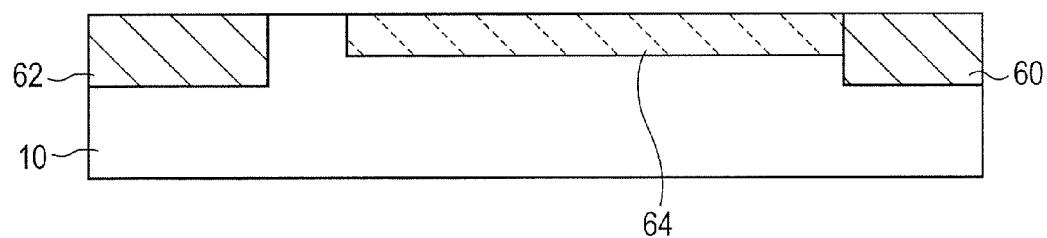

Next, a method of manufacturing the semiconductor device 102 according to this embodiment will be described. FIGS. 11A and 11B and FIGS. 12A and 12B are sectional views showing the method of manufacturing the semiconductor device 102 shown in FIG. 10. First, as shown in FIG. 11A, ions are implanted into the semiconductor substrate 10 to form the source region 62, drain region 60, and LDD region 64. The drain region 60 is spaced from the source region 62. The LDD region 64 is located between the source region 62 and drain region 60 and spaced from the source region 62 and in contact with the drain region 60. In this embodiment, for example, a p-type GaN substrate is used as the semiconductor substrate 10. The following procedure is taken to form the source region 62, drain region 60, and LDD region 64.

First, a resist film is formed over the semiconductor substrate 10. Then, a resist pattern which covers areas other than the areas for the formation of the source region 62 and drain region 60 is produced by exposure and development of the resist film. Then, ion implantation is done using the resist pattern as a mask. In the ion implantation process, for example, n-type impurities are implanted. The ion implantation process is performed with an implantation energy of 10.0 keV at a dose of $5 \times 10^{15}$ cm$^{-2}$. Then, the resist pattern over the semiconductor substrate 10 is removed.

Next, a resist film is formed over the semiconductor substrate 10. Then, a resist pattern which covers areas other than the area for the formation of the LDD region 64 is produced by exposure and development of the resist film. Then, ion implantation is done using the resist pattern as a mask the ion implantation process, for example, Si ions are implanted. The ion implantation process is performed with an implantation energy of 10 keV at a dose of $1 \times 10^{14}$ cm$^{-2}$. The resist pattern over the semiconductor substrate 10 is removed.

Next, a silicon oxide film is formed over the semiconductor substrate 10. The silicon oxide film is formed using the PECVD (Plasma-enhanced Chemical Vapor Deposition) method. The thickness of the silicon oxide film is, for example, 500 nm. Then, activation annealing is done on the semiconductor substrate 10. This activates the impurities implanted into the semiconductor substrate 10. The activation annealing process is performed, for example, in a nitrogen atmosphere at 1200° C. for one minute. The source region 62, drain region 60, and LDD region 64 as shown in FIG. 11A are thus formed.

Next, an element region (not shown) and an element isolation region (not shown) are formed in the semiconductor substrate 10. The following procedure is taken to form the element region and element isolation region. First, a resist pattern is made in an area which is to be an element region. Then, ions are implanted using the resist pattern as a mask. Impurities such as nitrogen ions or boron ions are used in this ion implantation process. This enhances the insulation quality of the area supposed to be the element isolation region. Consequently the element region is electrically isolated from another element region by the highly insulating element isolation region.

Figure 11B:
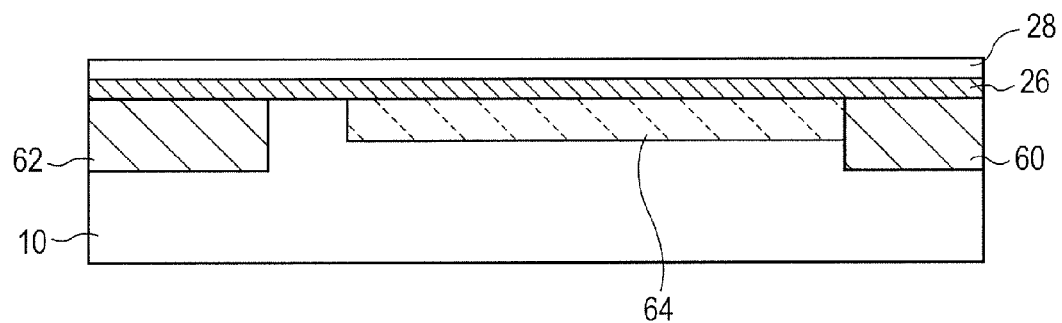
Figure 12A:
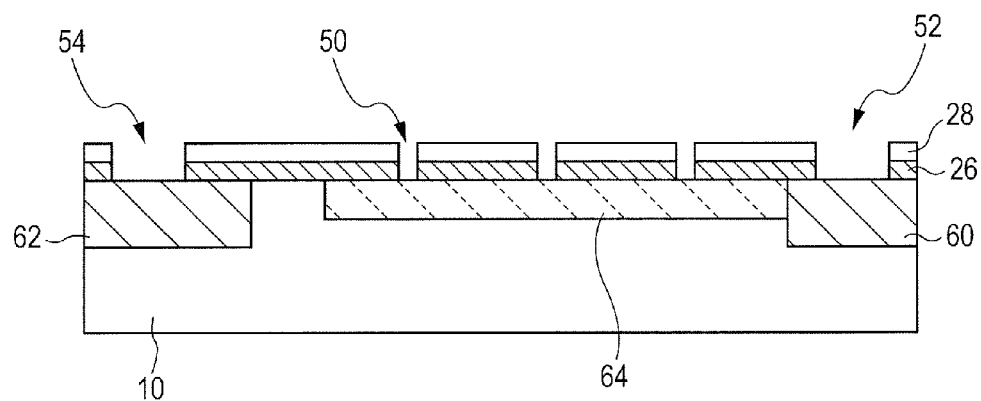
Figure 12B:
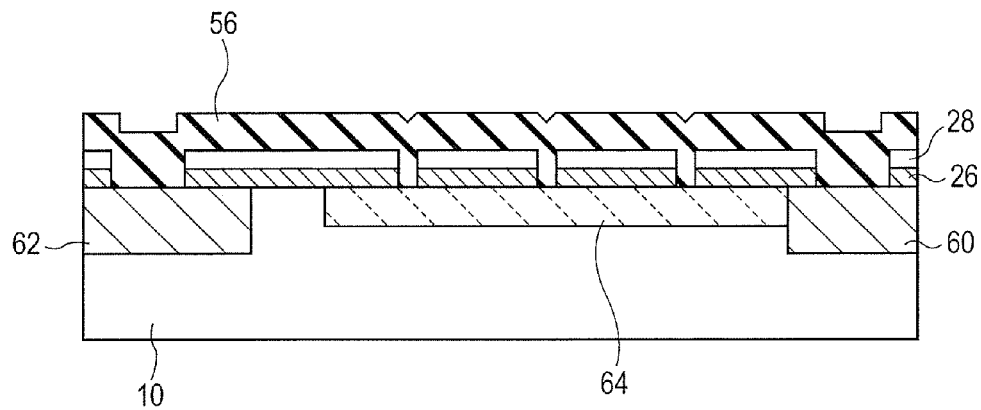

Next, the insulating film 26 and conductive film 28 are formed as shown in FIG. 11B. Then, the field plate contact holes 50, drain contact hole 52, and source contact hole 54 are formed in the insulating film 26 and conductive film 28 as shown in FIG. 11B. Then, as shown in FIG. 12B, the conductive film 56 is formed inside the field plate contact holes 50, drain contact hole 52, and source contact hole 54 and over the conductive film 28. Then, the conductive film 56 is selectively removed to form the gate electrode 20, drain electrode 22, source electrode 24, and field plate electrodes 30. These steps can be carried out in the same manner as in the first embodiment. The semiconductor device 102 shown in FIG. 10 is thus completed.

The second embodiment brings about the same advantageous effects as the first embodiment.

The presence of the field plate electrodes 30 enhances the drain withstand voltage of the semiconductor device 102. Therefore, while the impurity concentration of the LDD region is increased to reduce loss, the drain withstand voltage is enhanced.

Figure 13:
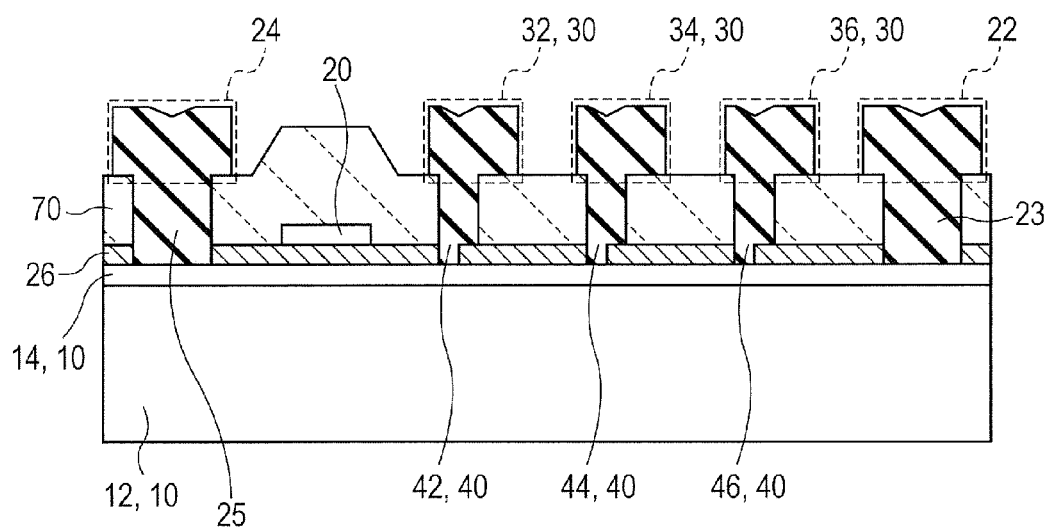
FIG. 13 is a sectional view showing a semiconductor device according to a third embodiment of the invention.

FIG. 13 is a sectional view showing a semiconductor device 104 according to a third embodiment of the invention, which corresponds to FIG. 1 for the first embodiment. The semiconductor device 104 according to the third embodiment is structurally the same as the semiconductor device 100 according to the first embodiment except the electrodes.

The semiconductor device 104 includes an interlayer insulating film 70 as shown in FIG. 13. The interlayer insulating film 70 is arranged over the insulating film 26 and gate electrode 20, covering the gate electrode 20 lying over the insulating film 26. The interlayer insulating film 70 is, for example, a silicon oxide film, silicon nitride film or alumina film.

The drain electrode 22, source electrode 24 and field plate electrodes 30 is arranged over the interlayer insulating film 70. The drain contact 23 penetrates the interlayer insulating film 70 and insulating film 26 to couple the drain electrode 22 to the semiconductor substrate 10. The source contact 25 penetrates the interlayer insulating film 70 and insulating film 26 to couple the source electrode 24 to the semiconductor substrate 10. The field plate contacts 40 penetrate the interlayer insulating film 70 and insulating film 26 to couple the field plate electrodes 30 to the semiconductor substrate 10.

Figure 14A:
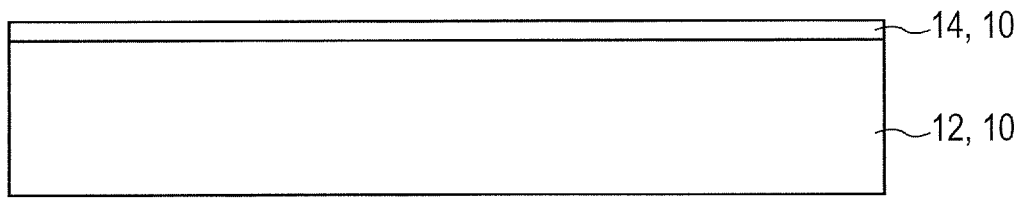
Figure 14B:
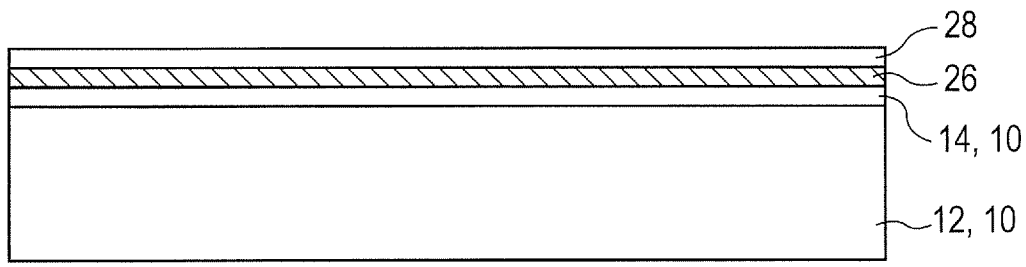

Next, a method of manufacturing the semiconductor device 104 according to this embodiment will be described. FIGS. 14A and 14B and FIGS. 15A and 15B are sectional views showing the method of manufacturing the semiconductor device 104 shown in FIG. 13. First, the semiconductor substrate 10 is prepared as shown in FIG. 14A. Then, the insulating film 26 and conductive film 28 are formed over the semiconductor substrate 10 as shown in FIG. 14B. These steps can be carried out in the same manner as in the first embodiment.

Figure 15A:
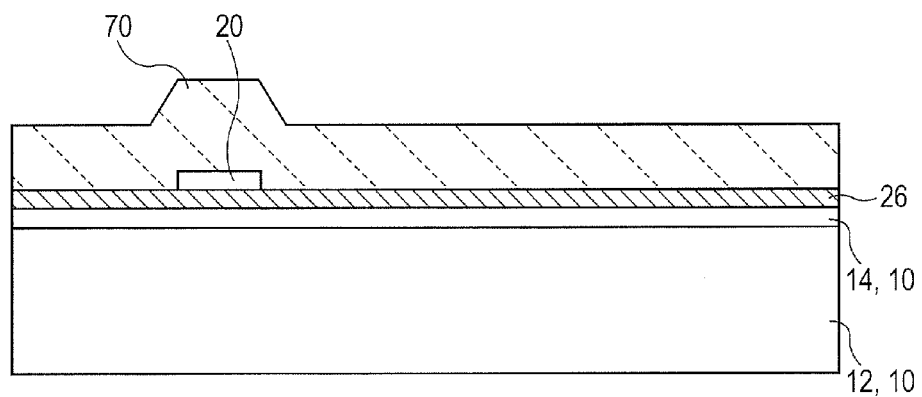

Next, a resist film is formed over the conductive film 28. Then, a resist pattern is made over the area for the formation of the gate electrode 20 by exposure and development of the resist film. Then, the conductive film 28 is dry-etched using the resist pattern as a mask. Then, ashing of the resist pattern over the conductive film 28 is done. Then, the resist pattern is removed with an organic removing solution. Consequently the gate electrode 20 is formed over the insulating film 26 as shown in FIG. 15A. In this embodiment, the gate electrode 20 is included only of the conductive film 28. Then, the interlayer insulating film 70 is formed over the insulating film 26 and gate electrode 20 as shown in FIG. 15A.

Figure 15B:
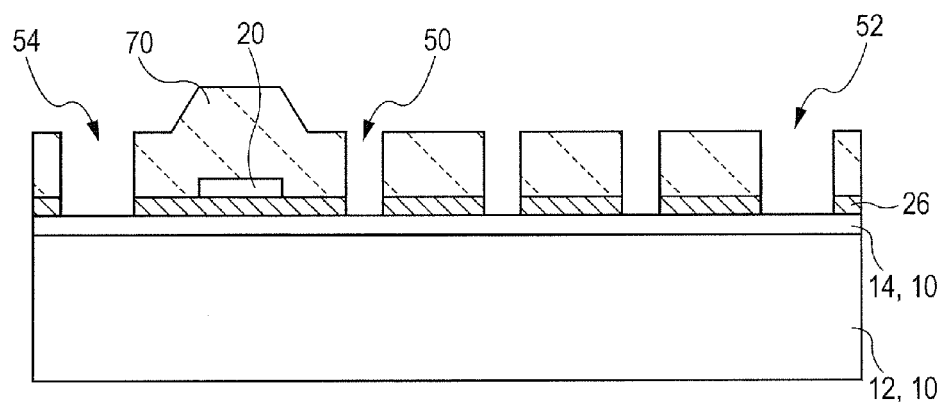

Then, as shown in FIG. 15B, the field plate contact holes 50, drain contact hole 52, and source contact hole 54 are formed inside the insulating film 26 and interlayer insulating film 70, penetrating the insulating film 26 and interlayer insulating film 70. The field plate contact holes 50, drain contact hole 52, and source contact hole 54 are formed, for example, by dry etching using the resist pattern formed over the interlayer insulating film 70 as a mask. For example, fluorinated gas may be used as the etching gas.

Next, the conductive film 56 is formed inside the field plate contact holes 50, drain contact hole 52, and source contact hole 54 and over the interlayer insulating film 70. Then, resist pattern is formed over the conductive film 56. Then, the drain electrode 22, source electrode 24, and field plate electrodes 30 are formed by etching the conductive film 56 using the resist pattern as a mask. At this time, the drain electrode 22 is coupled to the semiconductor substrate 10 through the drain contact 23. The source electrode 24 is coupled to the semiconductor substrate 10 through the source contact 25. The field plate electrodes 30 are coupled to the semiconductor substrate 10 through the field plate contacts 40. The drain electrode 22, source electrode 24, and field plate electrodes 30 are each included only of the conductive film 56. The semiconductor device 104 shown in FIG. 13 is thus completed.

The third embodiment brings about the same advantageous effects as the first embodiment.

The drain electrode 22, source electrode 24, and field plate electrodes 30 are arranged over the interlayer insulating film 70 covering the gate electrode 20. For this reason, unlike the first embodiment, in designing the arrangement of electrodes other than the gate electrode 20, it is unnecessary to take interference between the gate electrode 20 and other electrodes into consideration. This increases the degree of freedom in the arrangement of wirings.

The field plate electrodes 30 are arranged over the interlayer insulating film 70 covering the gate electrode 20. In other words, the layer where the gate electrode 20 is arranged is different from the layer where the field plate electrodes are arranged. This reduces the possibility that the arrangement of the gate electrode 20 and field plate electrodes 30 is limited due to the photoresist resolution limit or a similar reason. Consequently it is easy to produce the field plate electrodes 30.

Figure 16:
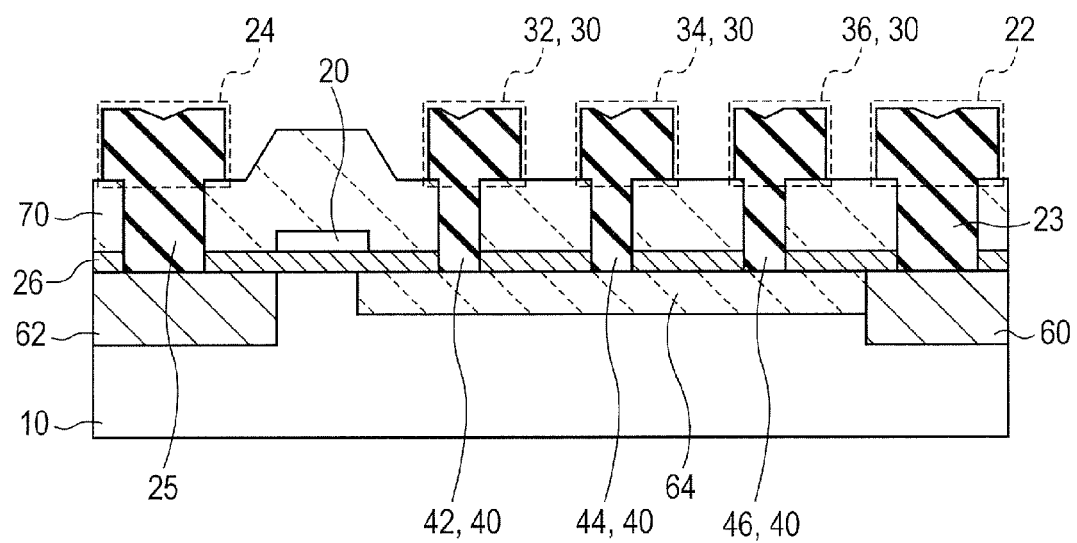
FIG. 16 is a sectional view showing a semiconductor device according to a fourth embodiment of the invention.

FIG. 16 is a sectional view showing a semiconductor device 106 according to a fourth embodiment of the invention, which corresponds to FIG. 13 for the third embodiment. The semiconductor device 106 according to the fourth embodiment is structurally the same as the semiconductor device 104 according to the third embodiment except the structure of the semiconductor substrate 10.

The semiconductor substrate 10 is structurally the same as the semiconductor substrate 10 of the semiconductor device 102 according to the second embodiment. Specifically the semiconductor substrate 10 includes the source region 62, drain region 60 and LDD region 64.

Figure 17A:
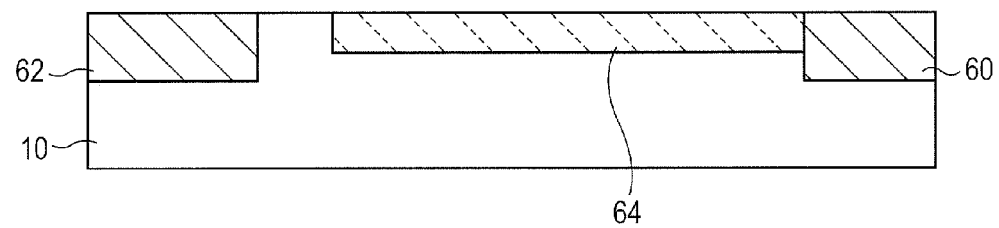
Figure 17B:
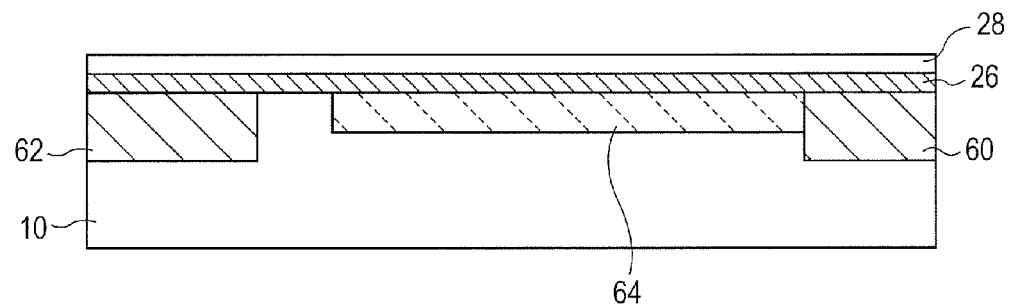

Next, a method of manufacturing the semiconductor device 106 according to this embodiment will be described. FIGS. 17A and 17B and FIGS. 18A and 18B are sectional views showing the method of manufacturing the semiconductor device 106 shown in FIG. 16. First, the drain region 60, source region 62, and LDD region 64 are formed in the semiconductor substrate 10 as shown in FIG. 17A. Then, the insulating film 26 and conductive film 28 are formed as shown in FIG. 17B. These steps can be carried out in the same manner as in the second embodiment.

Figure 18A:
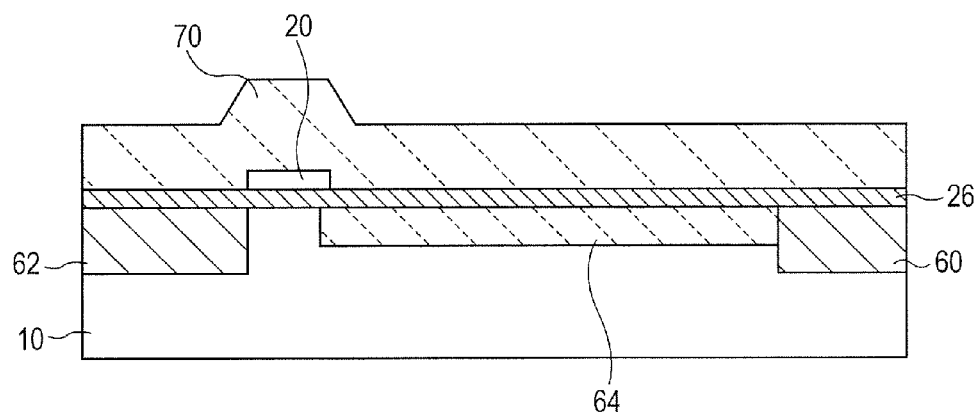
Figure 18B:
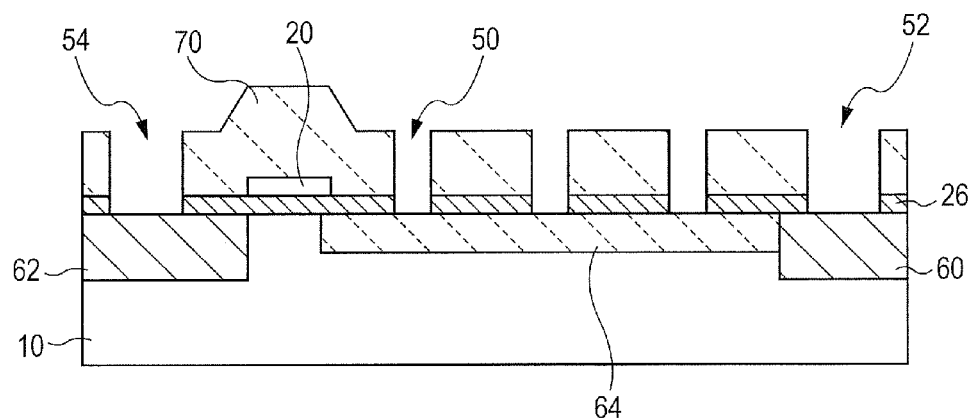

Next, the gate electrode 20 is formed as shown in FIG. 18A. Then, the interlayer insulating film 70 is formed over the gate electrode 20 and insulating film 26. Then, as shown in FIG. 18B, the field plate contact holes 50, drain contact hole 52, and source contact hole 54 are formed inside the insulating film 26 and interlayer insulating film 70. Then, the conductive film 56 is formed inside the field plate contact holes 50, drain contact hole 52, and source contact hole 54 and over the interlayer insulating film 70. Then, the conductive film 56 is etched to form the drain electrode 22, source electrode 24, and field plate electrodes 30. These steps can be carried out in the same manner as in the third embodiment. The semiconductor device 106 shown in FIG. 16 is thus completed.

The fourth embodiment brings about the same advantageous effects as the third embodiment.

Figure 19:
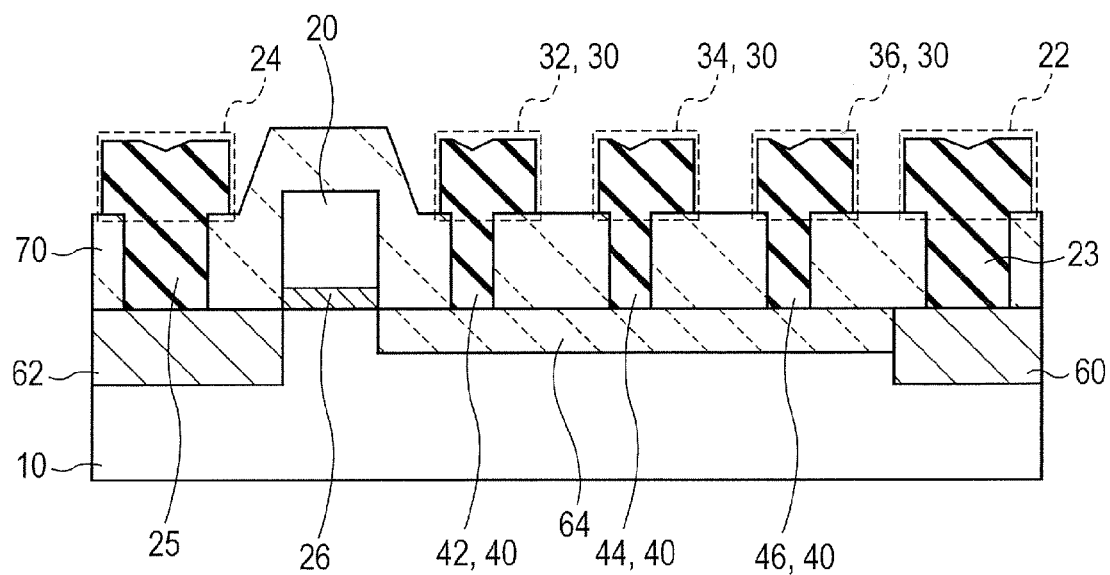
FIG. 19 is a sectional view showing a semiconductor device according to a fifth embodiment of the invention.

FIG. 19 is a sectional view showing a semiconductor device 108 according to a fifth embodiment of the invention, which corresponds to FIG. 16 for the fourth embodiment. The semiconductor device 108 according to the fifth embodiment is structurally the same as the semiconductor device 106 according to the fourth embodiment except that the diffusion layer of the semiconductor substrate 10 is formed by a self-align process.

Figure 20A:
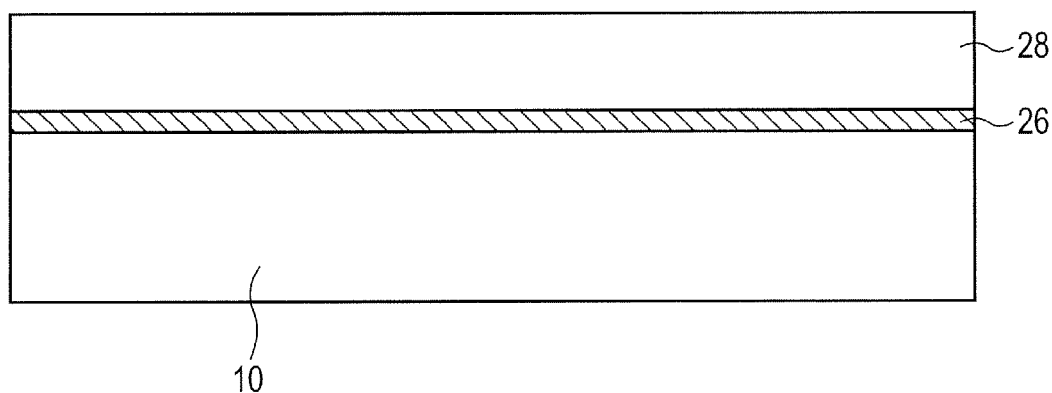

Next, a method of manufacturing the semiconductor device 108 according to this embodiment will be described. FIG. 20A to FIG. 22B are sectional views showing the method of manufacturing the semiconductor device 108 shown in FIG. 19. First, as shown in FIG. 20A, the insulating film 26 is formed over the semiconductor substrate 10. In this embodiment, for example, a p-type GaN substrate may be used as the semiconductor substrate 10. Then, the conductive film 28 is formed over the insulating film 26. The conductive film 28 is deposited, for example, by a CVD process. The conductive film 28 is, for example, a polycrystalline silicon film. The conductive film 28 may be doped with n-type impurities.

Figure 20B:
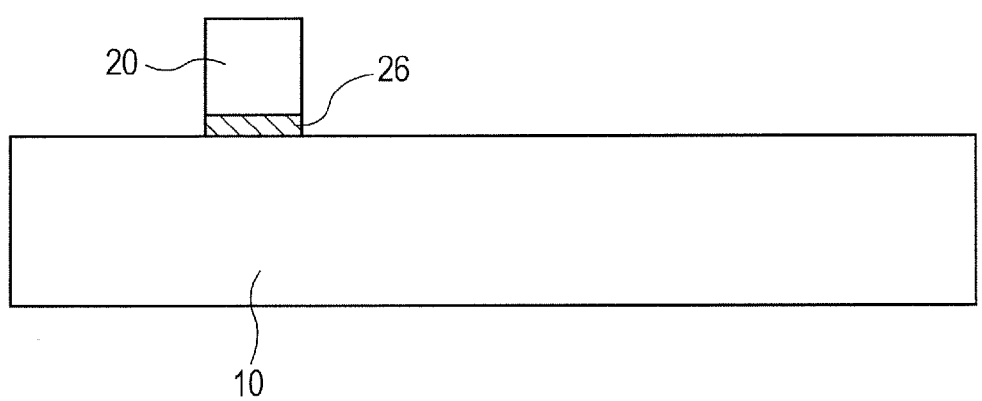

Next, a resist film is formed over the conductive film 28. Then, a resist pattern is made over the area for the formation of the gate electrode 20 by exposure and development of the resist film. Then, the conductive film 28 is dry-etched using the resist pattern as a mask. For example, chlorine gas may be used as the etching gas. As a consequence, the gate electrode 20 is completed as shown in FIG. 20B. Then, the resist pattern over the gate electrode 20 is removed. The resist pattern is removed, for example, by asking. In this process, as shown in FIG. 20B, the other portion of the insulating film 20 than the area under the gate electrode 20 can be removed by etching using the gate electrode 20 as a mask. This etching process can be carried out using, for example, an HF solution.

Figure 21A:
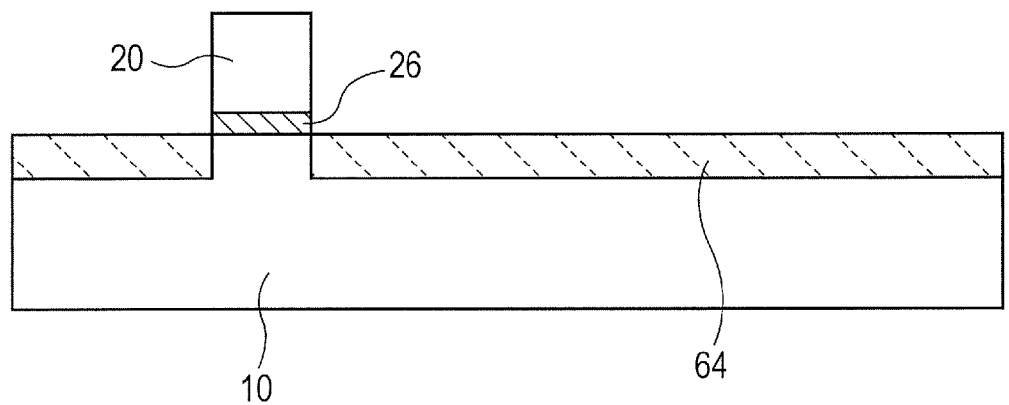
Figure 21B:
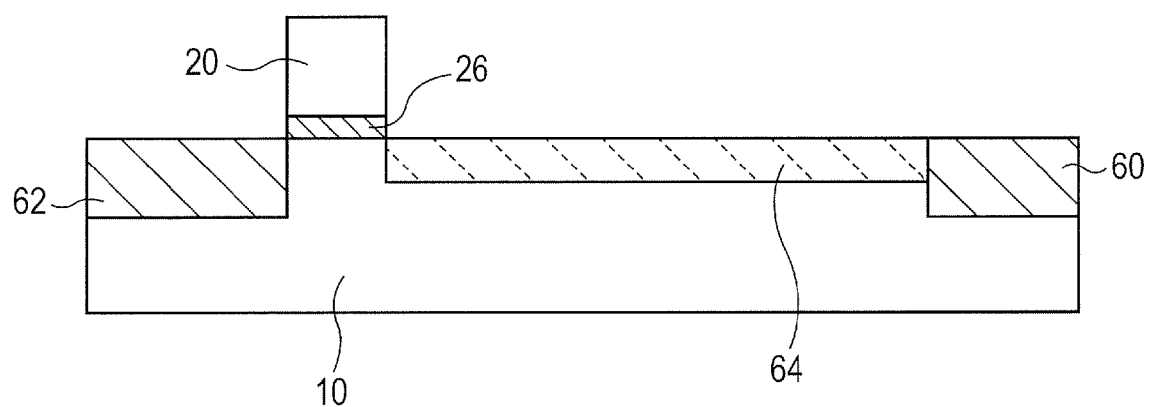

Next, the LDD region 64 is formed in the semiconductor substrate 10 as shown in FIG. 21A. The LDD region 64 is formed by implanting ions into the semiconductor substrate 10 using the gate electrode 20 as a mask. For example, the ion implantation process is performed with an implantation energy of 100 keV at a dose of $5 \times 10^{15}$ cm$^{-2}$. Then, as shown in FIG. 21B, the drain region 60 and source region 62 are formed in the semiconductor substrate 10. The following procedure is taken to form the drain region 60 and source region 62. First, a resist pattern is formed over the semiconductor substrate 10 and gate electrode 20 in a way to partially cover the LDD region 64 in the semiconductor substrate 10. Then, ions are implanted into the semiconductor substrate 10 using the resist pattern. For example, the ion implantation process is performed with an, implantation energy of 10 keV at a dose of $1 \times 10^{14}$ cm$^{-2}$. The drain, region 60 and source region 62 are thus formed in the semiconductor substrate 10. The order in which the step of forming the LDD region 64 and the step of forming the drain region 60 and source region 62 are carried out may be reversed.

Figure 22A:
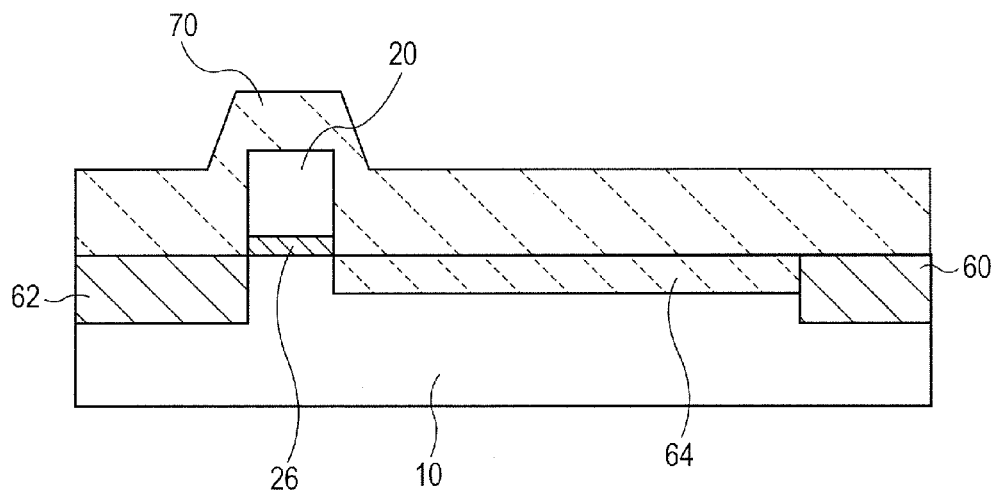

Next, the interlayer insulating film 70 is formed over the semiconductor substrate 10 and gate electrode 20 as shown in FIG. 22A. The interlayer insulating film 70 is formed, for example, by a PECVD process. The interlayer insulating film 70 is, for example, a silicon oxide film. The thickness of the interlayer insulating film 70 is, for example, 500 nm. Then, activation annealing is done, on the semiconductor substrate 10. This activates the impurities implanted into the semiconductor Substrate 10. The activation annealing process is performed in a nitrogen atmosphere at 1200° C. for one minute.

Figure 22B:
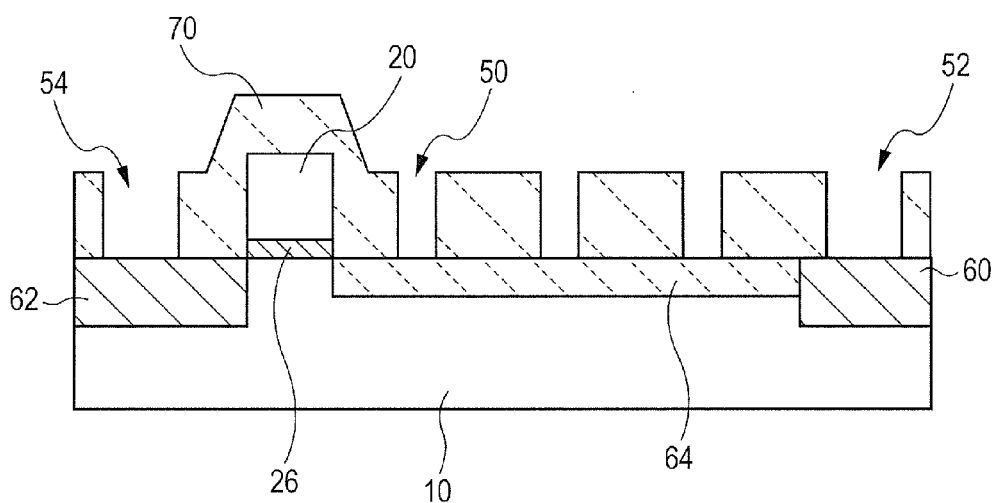

Next, as shown in FIG. 22B, the field plate contact holes 50, drain contact hole 52, and source contact hole 54 are formed in the interlayer insulating film 70. Then, the conductive film 56 is formed inside the field plate contact holes 50, drain contact hole 52, and source contact hole 54 and over the interlayer insulating film 70. Then, the conductive film 56 is etched to form the drain electrode 22, source electrode 24, and field plate electrodes 30. These steps can be carried out in the same manner as in the fourth embodiment.

The fifth embodiment brings about the same advantageous effects as the fourth embodiment.

So far the preferred embodiments of the present invention have been described referring to the drawings but they are only illustrative of the invention and the invention may be embodied in other various forms.

What is claimed is:

1. A semiconductor device comprising:
    a semiconductor substrate;
    a gate electrode provided over the semiconductor substrate;
    a source electrode provided over the semiconductor substrate and spaced from the gate electrode;
    a drain electrode located opposite to the source electrode with respect to the gate electrode in a plan view, provided over the semiconductor substrate and spaced from the gate electrode;
    at least one field plate electrode located between the gate electrode and the drain electrode in a plan view, provided over the semiconductor substrate through an insulating film and spaced from the gate electrode, the source electrode and the drain electrode; and
    at least one field plate contact provided in the insulating film, coupling the field plate electrode to the semiconductor substrate,
    the field plate electrode extending from the field plate contact at least either toward the source electrode or toward the drain electrode in a plan view.

2. The semiconductor device according to claim 1,
    wherein a plurality of the field plate electrodes are provided and spaced from each other in a first direction from the gate electrode toward the drain electrode; and
    wherein the field plate contact is provided on each of the field plate electrodes.

3. The semiconductor device according to claim 2,
    wherein all the field plate electrodes extend in one direction from the respective field plate contacts coupled to the field plate electrodes.

4. The semiconductor device according to claim 3,
    wherein the field plate electrodes extend in one direction from the respective field plate contacts coupled to the field plate electrodes and intervals between ends thereof in the one direction are equal to each other.

5. The semiconductor device according to claim 2,
    wherein the field plate electrodes and the field plate contacts each provided on each of the field plate electrodes are arranged so that when a voltage is applied to the drain electrode with gate voltage off, potentials applied to the drain electrode, the gate electrode, and the field plate electrodes vary with a linear gradient from the drain electrode to the gate electrode.

6. The semiconductor device according to claim 1,
    wherein the field plate electrode extends from the field plate contact toward the drain electrode in a plan view.

7. The semiconductor device according to claim 1,
    wherein the field plate electrode extends from the field, plate contact toward the source electrode in a plan view.

8. The semiconductor device according to claim 1,
    wherein the field plate electrode extends from the field plate contact toward both the source electrode and the drain electrode in a plan view.

9. The semiconductor device according to claim 1,
    wherein the semiconductor substrate has a two-dimensional electron gas layer.

10. The semiconductor device according to claim 1, further comprising:
    a source region and a drain region which are provided in the semiconductor substrate so as to be located on both sides of the gate electrode in a plan view; and an LDD region provided in the semiconductor substrate so as to be located between the gate electrode and the drain region in a plan view, wherein the source electrode is coupled to the source region;

wherein the drain electrode is coupled to the drain region; and wherein the field plate electrode is coupled to the LDD region.

11. The semiconductor device according to claim 1, wherein the insulating film also is arranged under the gate electrode, and wherein the insulating film lying under the gate electrode functions as a gate insulating film.

12. The semiconductor device according to claim 1, wherein the insulating film is arranged over the semiconductor substrate, covering the gate electrode.

13. The semiconductor device according to claim 12, wherein the gate electrode is arranged over a gate insulating film lying over the semiconductor substrate;

wherein the insulating film is arranged over the gate electrode and the gate insulating film, and wherein the field plate contact penetrates the insulating film and the gate insulating film and couples the field plate electrode to the semiconductor substrate.

* * * * *